(12) United States Patent
Paranthaman et al.

(10) Patent No.: US 7,432,229 B2
(45) Date of Patent: Oct. 7, 2008

(54) SUPERCONDUCTORS ON IRIDIUM SUBSTRATES AND BUFFER LAYERS

(75) Inventors: Mariappan P. Paranthaman, Knoxville, TN (US); Tolga Aytug, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 1003 days.

(21) Appl. No.: 10/809,174

(22) Filed: Mar. 23, 2004

(65) Prior Publication Data

US 2005/0239658 A1 Oct. 27, 2005

(51) Int. Cl.
*H01L 39/12* (2006.01)
*H01B 12/00* (2006.01)
*B32B 15/04* (2006.01)

(52) U.S. Cl. .............. 505/238; 505/237; 505/704; 505/740; 505/430; 505/480; 428/699; 428/702; 428/930; 174/125.1; 29/599

(58) Field of Classification Search .......... 505/230, 505/235–239, 470, 473–475, 704; 428/629, 428/633, 689, 699, 693.1, 930; 420/461, 420/901; 75/246; 148/435, 677, 676, 678; 257/43, 190
See application file for complete search history.

(56) References Cited

U.S. PATENT DOCUMENTS

| | | | |
|---|---|---|---|
| 3,395,000 A * | 7/1968 | Hanak et al. ............. 428/642 |
| 5,432,151 A | 7/1995 | Russo et al. | |
| 5,650,378 A | 7/1997 | Iijima et al. | |
| 5,739,086 A | 4/1998 | Goyal et al. | |
| 5,741,377 A | 4/1998 | Goyal et al. | |
| 5,872,080 A | 2/1999 | Arendt et al. | |
| 5,898,020 A | 4/1999 | Goyal et al. | |
| 5,958,599 A | 9/1999 | Goyal et al. | |
| 5,964,966 A | 10/1999 | Goyal et al. | |
| 5,968,877 A | 10/1999 | Budai et al. | |
| 5,972,847 A | 10/1999 | Feenstra et al. | |
| 6,077,344 A | 6/2000 | Shoup et al. | |
| 6,106,615 A | 8/2000 | Goyal et al. | |
| 6,114,287 A | 9/2000 | Lee et al. | |
| 6,150,034 A | 11/2000 | Paranthaman et al. | |
| 6,156,376 A | 12/2000 | Paranthaman et al. | |
| 6,159,610 A | 12/2000 | Paranthaman et al. | |
| 6,180,570 B1 | 1/2001 | Goyal | |
| 6,190,752 B1 | 2/2001 | Do et al. | |
| 6,214,772 B1 | 4/2001 | Iijima et al. | |
| 6,235,402 B1 | 5/2001 | Shoup et al. | |
| 6,256,521 B1 | 7/2001 | Lee et al. | |
| 6,261,704 B1 | 7/2001 | Paranthaman et al. | |
| 6,265,353 B1 | 7/2001 | Kinder et al. | |

(Continued)

FOREIGN PATENT DOCUMENTS

GB WO 01/83855 A1 * 11/2001

OTHER PUBLICATIONS

JPL, Iridium-Data Sheet, pp. 2, Copyright-2003.*

(Continued)

*Primary Examiner*—Stanley Silverman
*Assistant Examiner*—Kallambella Vijayakumar
(74) *Attorney, Agent, or Firm*—Joseph A. Marasco

(57) ABSTRACT

Laminated, biaxially textured superconductors include Ir-based buffer layers and/or substrates.

3 Claims, 16 Drawing Sheets

U.S. PATENT DOCUMENTS

| | | |
|---|---|---|
| 6,270,908 B1 | 8/2001 | Williams et al. |
| 6,316,391 B1 | 11/2001 | Doi |
| 6,331,199 B1 | 12/2001 | Goyal et al. |
| 6,361,598 B1 * | 3/2002 | Balachandran et al. ......... 117/86 |
| 6,375,768 B1 | 4/2002 | Goyal |
| 6,399,154 B1 | 6/2002 | Williams et al. |
| 6,428,635 B1 * | 8/2002 | Fritzemeier et al. ......... 148/435 |
| 6,440,211 B1 | 8/2002 | Beach et al. |
| 6,447,714 B1 | 9/2002 | Goyal et al. |
| 6,451,450 B1 * | 9/2002 | Goyal et al. ................ 428/629 |
| 6,455,166 B1 | 9/2002 | Truchan |
| 6,468,591 B1 | 10/2002 | Paranthaman et al. |
| 6,486,100 B1 | 11/2002 | Lee et al. |
| 6,537,689 B2 * | 3/2003 | Schoop et al. .............. 428/701 |
| 6,599,346 B2 | 7/2003 | Goyal et al. |
| 6,602,313 B2 | 8/2003 | Goyal et al. |
| 6,607,838 B2 | 8/2003 | Goyal et al. |
| 6,607,839 B2 | 8/2003 | Goyal et al. |
| 6,610,413 B2 | 8/2003 | Goyal et al. |
| 6,610,414 B2 | 8/2003 | Goyal et al. |
| 6,617,283 B2 * | 9/2003 | Paranthaman et al. ....... 505/238 |
| 6,632,539 B1 | 10/2003 | Iijima et al. |
| 6,635,097 B2 | 10/2003 | Goyal et al. |
| 6,645,313 B2 | 11/2003 | Goyal et al. |
| 6,663,976 B2 | 12/2003 | Beach et al. |
| 6,670,308 B2 | 12/2003 | Goyal |
| 6,740,421 B1 | 5/2004 | Goyal |
| 6,764,770 B2 | 7/2004 | Paranthaman et al. |
| 6,872,988 B1 * | 3/2005 | Goyal ......................... 257/190 |
| 2003/0143438 A1 | 7/2003 | Norton et al. |
| 2004/0033904 A1 * | 2/2004 | Moore et al. ................ 505/100 |
| 2004/0157747 A1 * | 8/2004 | Chen et al. .................. 505/238 |

OTHER PUBLICATIONS

U.S. Appl. No. 10/189,678, filed Jul 3, 2002, Goyal.

* cited by examiner

SUPERCONDUCTORS ON IRIDIUM SUBSTRATES AND BUFFER LAYERS

The United States Government has rights in this invention pursuant to contract no. DE-AC05-00OR22725 between the United States Department of Energy and UT-Battelle, LLC.

CROSS-REFERENCE TO RELATED APPLICATIONS

Specifically referenced is a U.S. patent application entitled "Semiconductor Films on Flexible Ir Substrates" filed on even date herewith.

FIELD OF THE INVENTION

The present invention relates to laminated, biaxially textured superconductors, and more particularly to such articles having Ir or Ir-based buffer layers and/or substrates.

BACKGROUND OF THE INVENTION

Superconducting materials have been applied epitaxially to biaxially textured support materials in the ongoing effort to fabricate robust, flexible superconductors characterized by sufficiently high high critical current density ($J_c$) and scalability to industrially useful lengths. An important class of substrates is known as rolling assisted, biaxially textured substrates (RABiTS). The present invention is an important stepping stone in that effort.

Biaxial texture refers to {100}<100> crystallographic orientations both parallel and perpendicular to the basal plane of a material. A material having biaxial texture of sufficient quality for superconductor applications can be generally defined as being characterized by an x-ray diffraction phi scan peak of no more than 20° FWHM. Other suitable definitions have also been set forth in varying terms. For the purpose of the description of the present invention, biaxial texture is construed to include single-crystal morphology.

It is helpful to review some of the prior work that the present invention builds upon. The entire disclosure of each of the following U.S. patents is incorporated herein by reference:

U.S. Pat. No. 5,739,086 issued on Apr. 14, 1998 to Goyal, et al.
U.S. Pat. No. 5,964,966 issued on Oct. 12, 1999 to Goyal, et al.
U.S. Pat. No. 5,968,877 issued on Oct. 19, 1999 to Budai, et al.
U.S. Pat. No. 5,972,847 issued on Oct. 26, 1999 to Feenstra, et al.
U.S. Pat. No. 6,077,344 issued on Jun. 20, 2000 to Shoup, et al.
U.S. Pat. No. 6,114,287 issued on Sep. 5, 2000 to Lee, et al.
U.S. Pat. No. 6,150,034 issued on Nov. 21, 2000 to Paranthaman, et al.
U.S. Pat. No. 6,159,610 issued on Dec. 12, 2000 to Paranthaman, et al.
U.S. Pat. No. 6,180,570 issued on Jan. 30, 2001 to Goyal.
U.S. Pat. No. 6,256,521 issued on Jul. 3, 2001 to Lee, et al.
U.S. Pat. No. 6,261,704 issued on Jul. 17, 2001 to Paranthaman, et al.
U.S. Pat. No. 6,270,908 issued on Aug. 7, 2001 to Williams, et al.
U.S. Pat. No. 6,331,199 issued on Dec. 18, 2001 to Goyal, et al.
U.S. Pat. No. 6,440,211 issued on Aug. 27, 2002 to Beach, et al.
U.S. Pat. No. 6,447,714 issued on Sep. 10, 2002 to Goyal, et al.
U.S. Pat. No. 6,451,450 issued on Sep. 17, 2002 to Goyal, et al.
U.S. Pat. No. 6,617,283 issued on Sep. 9, 2003 to Paranthaman, et al.
U.S. Pat. No. 6,645,313 issued on Nov. 11, 2003 to Goyal, et al.
U.S. Pat. No. 6,670,308 issued on Dec. 30, 2003 to Goyal.
U.S. Patent Application Publication No. 20030143438 published on Jul. 31, 2003 to Norton, et al.
U.S. patent application Ser. No. 10/324,883 filed on Dec. 19, 2002.
U.S. patent application Ser. No. 10/620,251 filed on Jul. 14, 2003.

Moreover, there are other known routes to flexible electromagnetic devices known as ion-beam-assisted deposition (IBAD) and inclined-substrate deposition (ISD). IBAD processes are described in U.S. Pat. Nos. 6,632,539, 6,214,772, 5,650,378, 5,872,080, 5,432,151 and 6,361,598; ISD processes are described in U.S. Pat. Nos. 6,190,752 and 6,265,353; all these patents are incorporated herein by reference.

Some of the problems that have been encountered are substrate and/or buffer layer oxidation, diffusion of substrate components into the other buffers and/or superconductors, and instability (e.g., thermal runaway) of the superconductors during an over-current situation. For example, the use of Cu substrates would be desirable because they would enable reduced ferromagnetism, higher electrical conductivity, higher heat capacity, and lower cost compared with Ni and Ni alloys. However, Cu is particularly susceptible to problems such as those mentioned above.

OBJECTS OF THE INVENTION

Accordingly, objects of the present invention include provision of a laminate superconductor system that has features which prevent substrate oxidation and diffusion of substrate components into the other buffers and/or superconductors, which provides stabilization to the superconductor during an over-current situation, which eliminates the need for a conventional copper stabilizer layer on top of the superconductor, and which reduces AC loss. Further and other objects of the present invention will become apparent from the description contained herein.

SUMMARY OF THE INVENTION

In accordance with one aspect of the present invention, the foregoing and other objects are achieved by a laminate superconducting article that includes: a substrate; a biaxially textured buffer system on the substrate, the biaxially textured buffer system including at least an Ir buffer layer; and an epitaxial layer of a superconductor on the biaxially textured buffer system.

In accordance with another aspect of the present invention, a laminate superconducting article includes: a substrate comprising biaxially textured Ir; and biaxially textured superconductor on the Ir substrate.

In accordance with a further aspect of the present invention, a laminate superconducting article includes: a substrate comprising biaxially textured Ir; a biaxially textured buffer system on the substrate; and an epitaxial layer of a superconductor on the biaxially textured buffer system.

Figure 2:
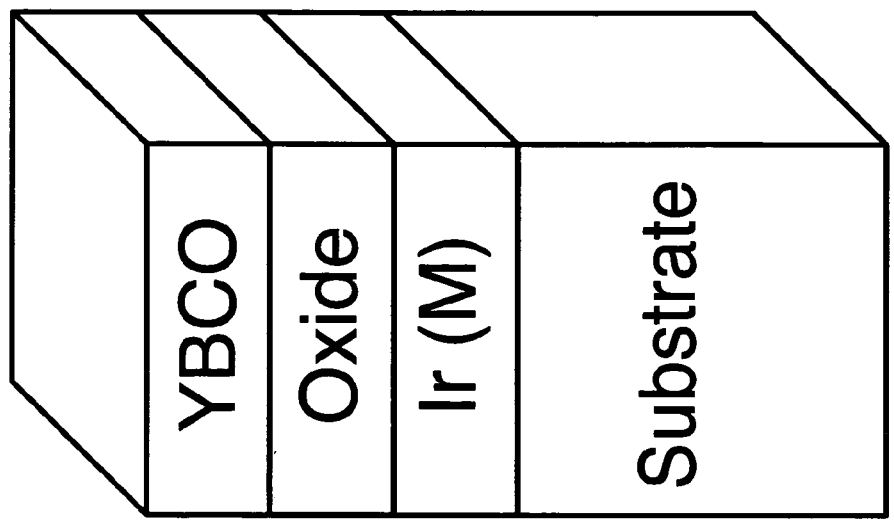
FIGS. 1-8 and 19-22 are schematic illustrations of various laminate architectures in accordance with the present invention.
Figure 1:
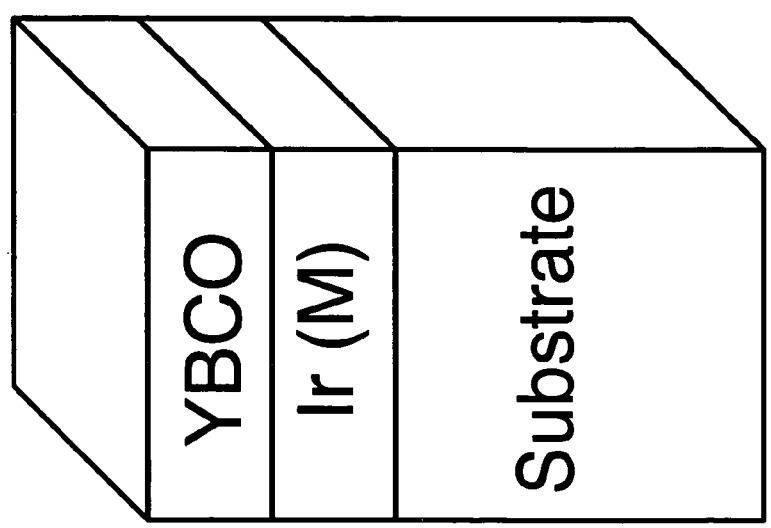
Figure 4:
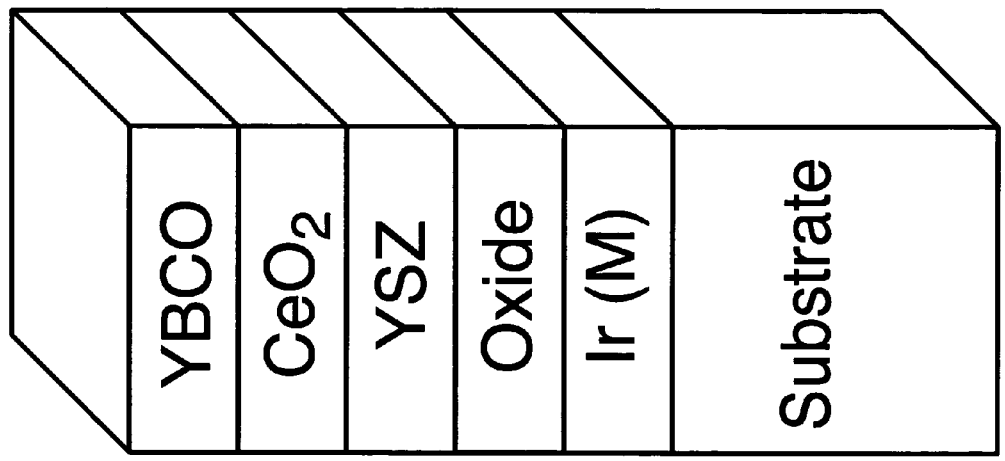
Figure 3:
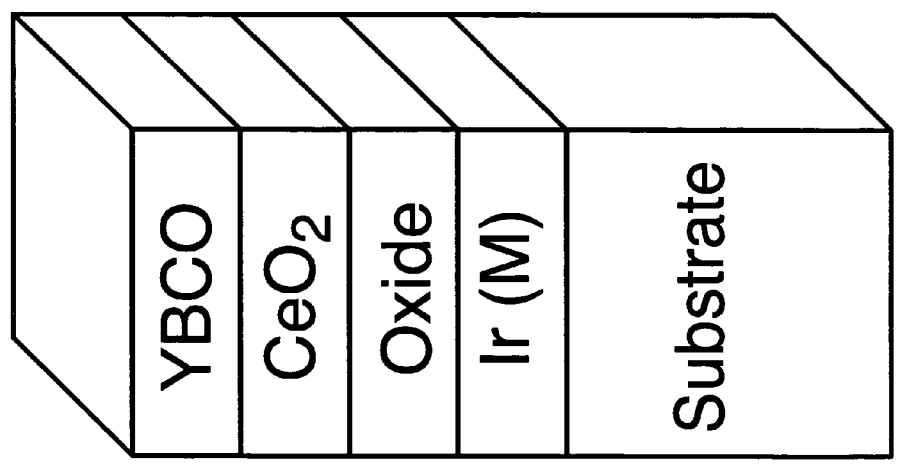
Figure 6:
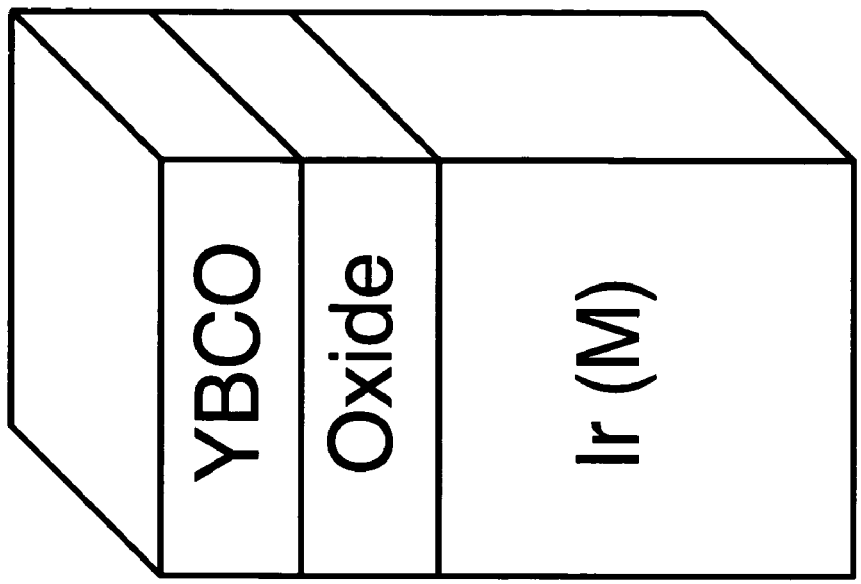
Figure 5:
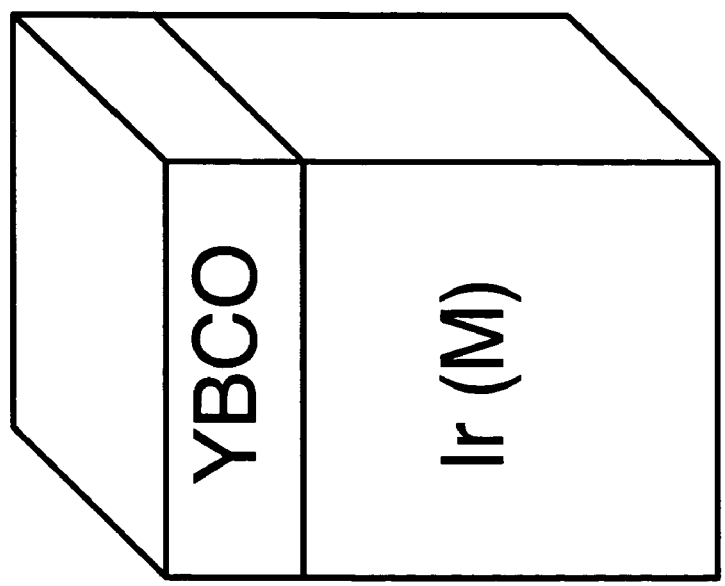
Figure 8:
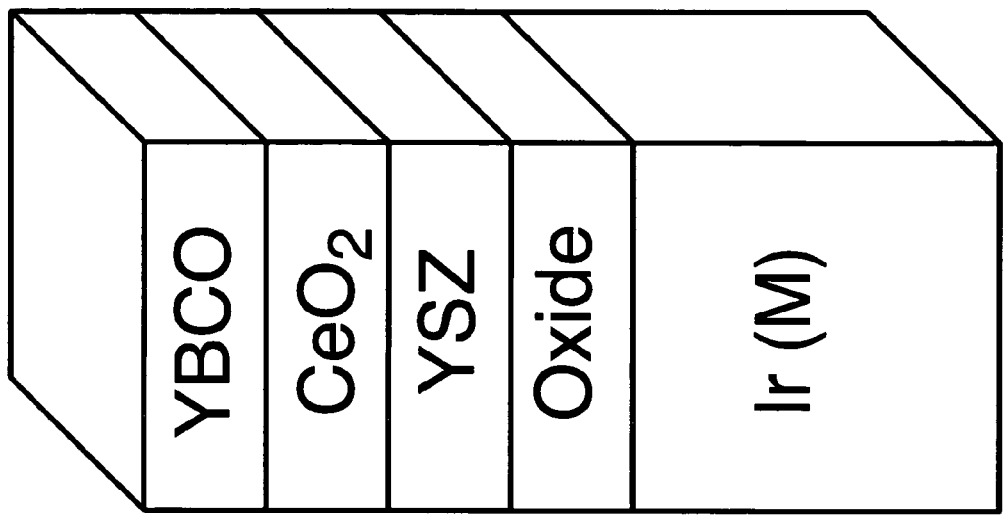
Figure 7:
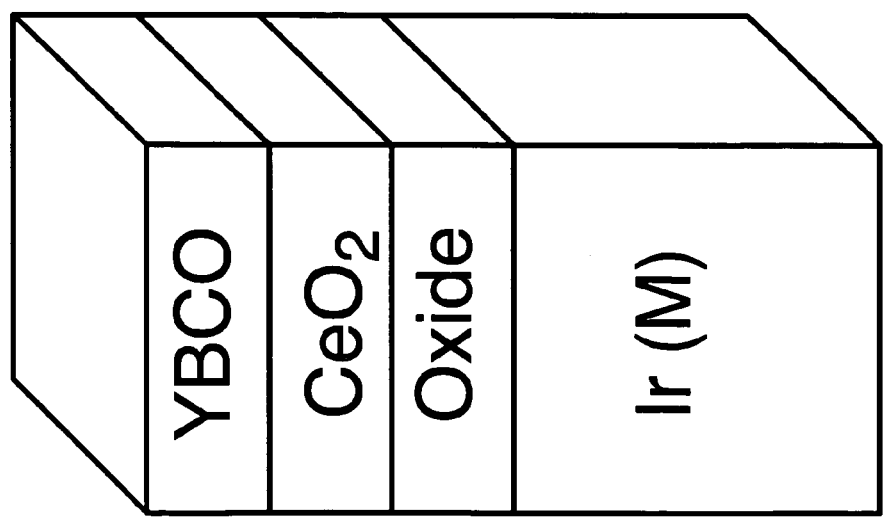

For a better understanding of the present invention, together with other and further objects, advantages and capabilities thereof, reference is made to the following disclosure and appended claims in connection with the above-described drawings.

DETAILED DESCRIPTION OF THE INVENTION

Coated conductor applications in power technologies require stabilization of the high-temperature superconducting (HTS) layers against thermal runaway. One route to stabilization is through the use of conducting buffer layers that provide good electrical and/or thermal connectivity throughout the laminate structure. Such a structure eliminates the need for a conventional copper stabilizer layer on top of the superconductor, resulting in reduced wire thickness and hence increase the overall engineering current density. Moreover, it is desirable to employ non-magnetic substrate and buffer components in order to reduce AC loss in superconductor systems. Ir and Ir-based buffer layers and substrates have been unexpectedly found to be beneficial in attaining the foregoing benefits.

Ir or an Ir alloy can be used as a buffer layer on a substrate, a layer in a buffer system, or can serve as the substrate itself. It is critical to the invention that a biaxially textured superconductor layer is above a layer of biaxially textured Ir or Ir Alloy. Various laminate architectures are possible within the scope of the invention, as will be seen hereinbelow.

Ir is advantageous as applied in the present invention for various reasons. For example, Ir has a face-centered cubic crystalline structure with a lattice parameter of 3.839 Å and has a suitable match with YBCO (within 0.5%). Moreover, Ir is non-magnetic. Suitable Ir alloys having cubic symmetry include, but are not limited to $Ir_{1-x}M_x$ wherein M comprises at least one element selected from the group consisting of Ta, Ti, Cu, Pt, Pd, Ru, Rh, Os, Au, and Ag.

Suitable substrates can have single crystal, biaxially textured, or untextured surfaces. The substrate can be any suitable material that can support a biaxially textured buffer layer of Ir. Suitable substrate materials include, but are not limited to stainless steel, Cu, Ni, Fe, Al, Ag, and alloys of any of the foregoing. Suitable alloying elements include, but are not limited to W, Cr, V, and Mn. Suitable substrate alloys include, but are not limited to Ni—W, Ni—Cr, Ni—Cr—W, Ni—Cr—V, Ni—V, and Ni—Mn. Suitable oxide substrates include, but are not limited to MgO, $SrTiO_3$, and $REAlO_3$, where RE comprises at least one rare-earth element, namely Y, La, Ce, Pr, Nd, Pm, Sm, Eu, Gd, Tb, Dy, Ho Er, Tm, Yb, and Lu. Substrate/Ir laminates can be prepared by any suitable method, including, but not limited to RABiTS, ion-beam assisted deposition (IBAD), and inclined-substrate deposition (ISD).

Further buffer layers can be deposited on the Ir, to form a buffer system. A buffer system generally comprises the layers between the substrate and the superconductor layer. Buffer systems in accordance with the present invention can comprise any known architecture, and can be deposited by any known means, as long as there is a layer of biaxially textured Ir present. Some examples of suitable deposition methods include, but are not limited to: physical vapor deposition (PVD) which includes pulsed laser deposition (PLD), electron beam evaporation, sputtering (reactive, rf, dc, for example), etc.; chemical vapor deposition (CVD) which includes metal-organic CVD (MOCVD), sol-gel deposition, metal-organic deposition, spray pyrolysis, plasma spray, etc.; and plating methods such as elctrodeposition and electroless deposition.

Some examples of suitable buffer layers include, but are not limited to TiN, $CeO_2$, $Y_2O_3$, $SrTiO_3$, $BaZrO_3$, $BaSnO_3$, $BaCeO_3$, YSZ, $(RE_{1-x}Sr_x)MnO_3$, $REMnO_3$, $RE_2O_3$, $REAlO_3$, $RE_2Zr_2O_7$, $RE_3NbO_7$, RESMO, and REMO where RE comprises at least one rare-earth element, namely Y, La, Ce, Pr, Nd, Pm, Sm, Eu, Gd, Tb, Dy, Ho Er, Tm, Yb, and Lu, and where M comprises at least one metal. Some specific examples of suitable conductive buffer layers are $LaNiO_3$, $La_{0.7}Ca_{0.3}MnO_3$, $LaCoO_3$, $La_{0.5}Sr_{0.5}TiO_3$, $SrRuO_3$, and $La_2CuO_4$.

A superconductor such as REBCO is subsequently deposited on the buffered substrate. RE comprises at least one rare-earth element, namely Y, La, Ce, Pr, Nd, Pm, Sm, Eu, Gd, Tb, Dy, Ho Er, Tm, Yb, and Lu. FIGS. 1-8 illustrate some of the various buffer systems that can be made with YBCO in accordance with the present invention.

Fundamental studies were conducted by depositing buffer layers on biaxially textured Cu and Ni—W (3%) alloy substrates. Ir was identified as a diffusion barrier for both Cu and Ni and was used as a seed layer grown epitaxially on textured Cu- and Ni-based substrates.

EXAMPLE I

Biaxially textured Cu {100}<100> substrates were obtained by mechanical deformation of Cu rods to about a 95% reduction in thickness. This was followed by recrystallization to the desired {100}<001> cube texture by annealing at 800° C. for 1-2 h in a high-vacuum furnace with a base pressure of $2 \times 10^{-6}$ Torr. Similarly, substrates with reduced magnetism, Ni—W (3%) were also produced. The 50 μm thick as-rolled Cu and Ni-alloy substrates were cleaned in isopropanol prior to annealing. After annealing, the Cu substrates were mounted on a heater block using Ag paint and loaded into a vacuum chamber for on-axis sputtering. An Ir metal layer was epitaxially deposited on Cu substrates using dc sputtering of metal target that was 2.0 inches diameter and 0.25 inch thick and a power of ~100 Watt. Ir layers were deposited at temperatures ranging from 400-700° C. in the presence of Argon and/or Argon-$H_2$ 4% gas mixtures. The Ir film thickness was varied in the range of 10-200 nm. The sputtering pressure was approximately 5 mTorr.

In some embodiments, a conducting $La_{0.7}Sr_{0.3}MnO_3$ (LSMO) layer was deposited epitaxially on the Ir layer for structural compatibility with YBCO.

EXAMPLE II $La_{0.7}Sr_{0.3}MnO_3$ (LSMO) buffer layers were deposited on Ir buffered substrates made in accordance with Example I using an rf-magnetron sputtering system with a base pressure of $1 \times 10^{-6}$ Torr, using oxide sputter targets that were 95 mm in diameter and a power of 67 Watt. Unlike sintered and hard-pressed $CeO_2$ and YSZ targets, the LSMO target was made from a single-phase LSMO powder, which was lightly packed into a copper tray. Deposition of LSMO buffer layer was accomplished at substrate temperatures ranging from 550-650° C. in the presence of Argon and/or Argon-$H_2$ (4%) mixture. Oxygen was not added intentionally. In some experiments, water was added into the system to produce stoichiometric LSMO films. The deposition rate was ~0.71 Å/sec. The LSMO film thickness was varied in the range 200-300 nm to investigate the effect on the microstructure and on the superconducting properties of the subsequent HTS layer. The sputtering pressure was around 3 mTorr. In some experiments, Ir was deposited at room temperature, followed by post-annealing at 400° C., with good results.

In similar fashion to rf magnetron sputtering, LSMO buffer layers can be deposited reactively using metal targets and DC sputtering. moreover, it is possible to sputter buffer layers in the presence of $O_2$.

Buffer layers made in accordance with Examples I and II were analyzed by X-ray diffraction. A Philips model XRG3100 diffractometer with Cu Kα radiation was used to record powder diffraction patterns. A Picker four-circle diffractometer was used to determine the texture of the films. SEM micrographs were taken using a JOEL JSM-840. The thicknesses of both buffers were determined by both Rutherford backscattering spectroscopy (RBS).

Figure 9:
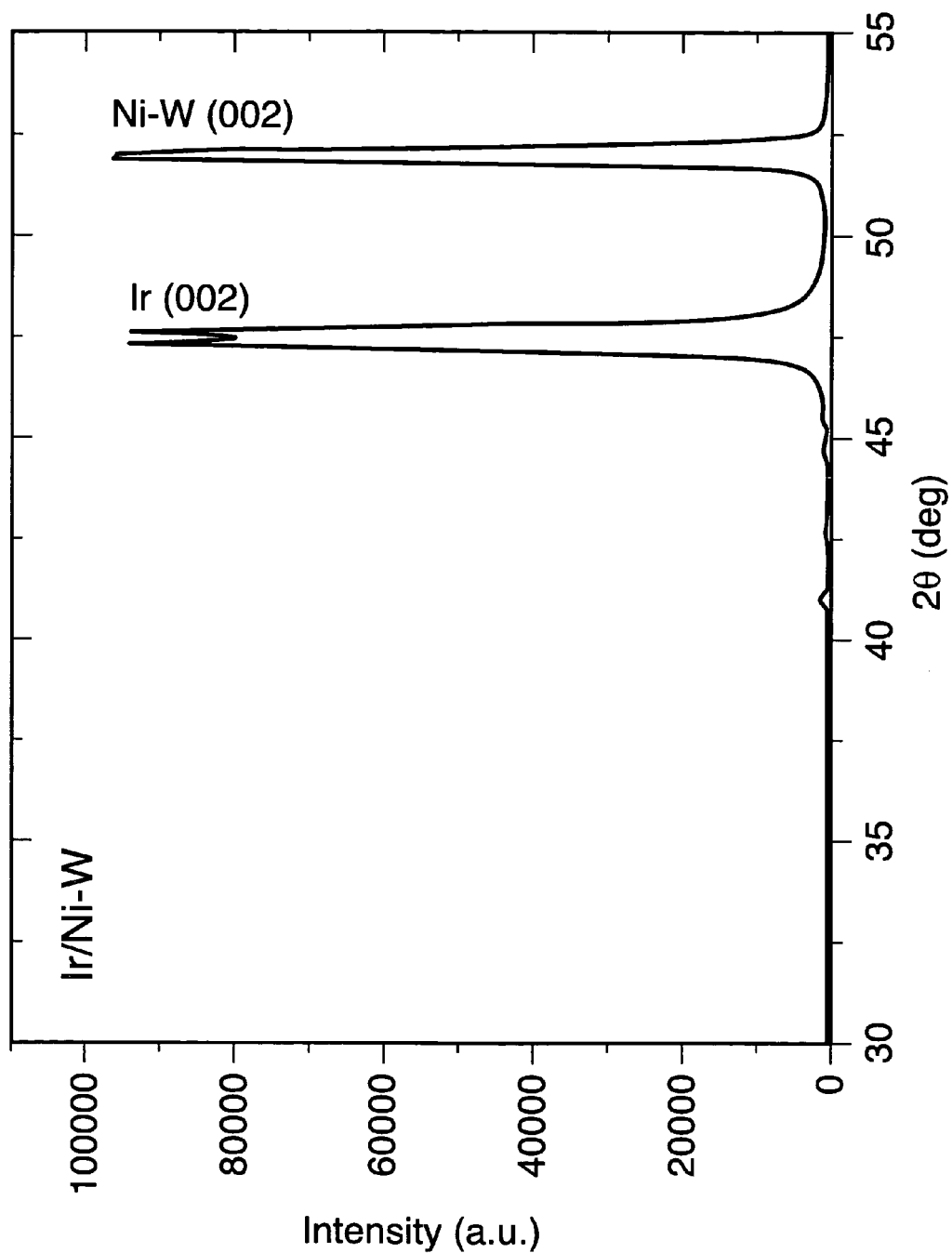
FIG. 9 is a graph of a typical $\theta$-$2\theta$ scan for a biaxially textured, 200 nm thick Ir buffer layer on {100}<001> Ni—W (3%) substrate in accordance with the present invention.
Figure 10:
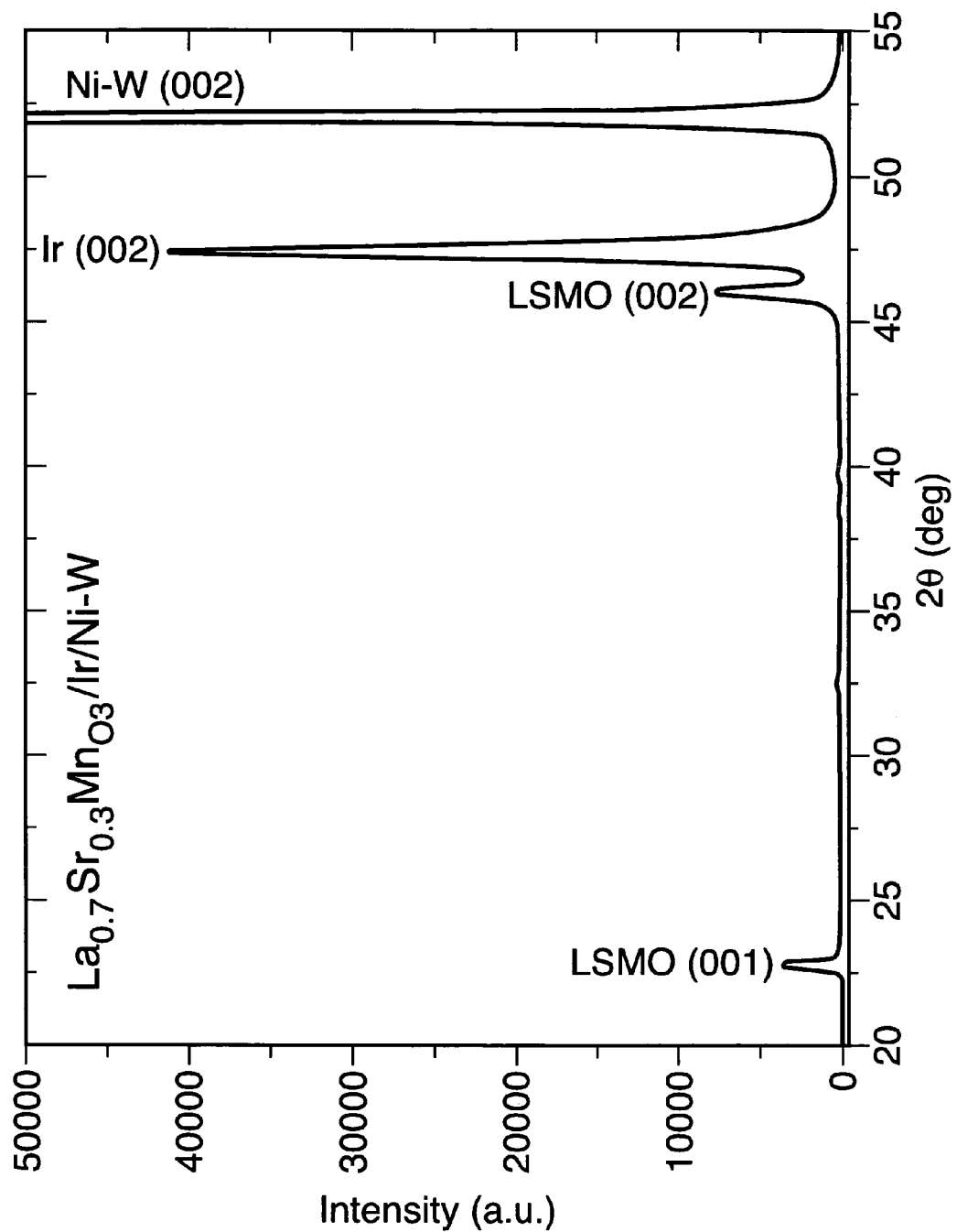
FIG. 10 is a graph of a typical $\theta$-$2\theta$ scan for a biaxially textured, 200 nm thick LSMO buffer layer on Ir-buffered/ Ni—W (3%) substrate in accordance with the present invention.
Figure 11:
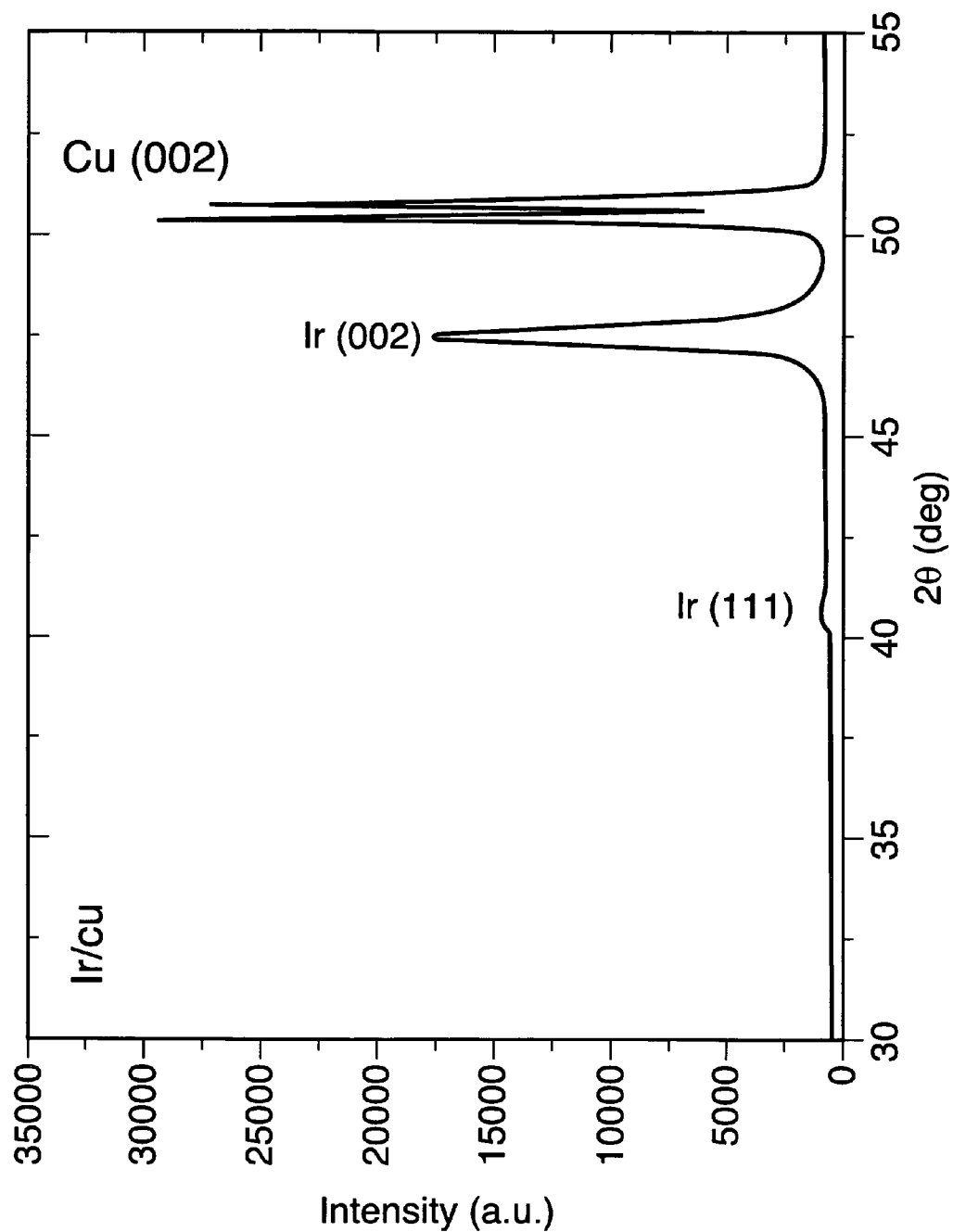
FIG. 11 is a graph of a typical $\theta$-$2\theta$ scan for a biaxially textured, 200 nm thick Ir buffer layer on {100}<001> Cu substrate in accordance with the present invention.
Figure 12:
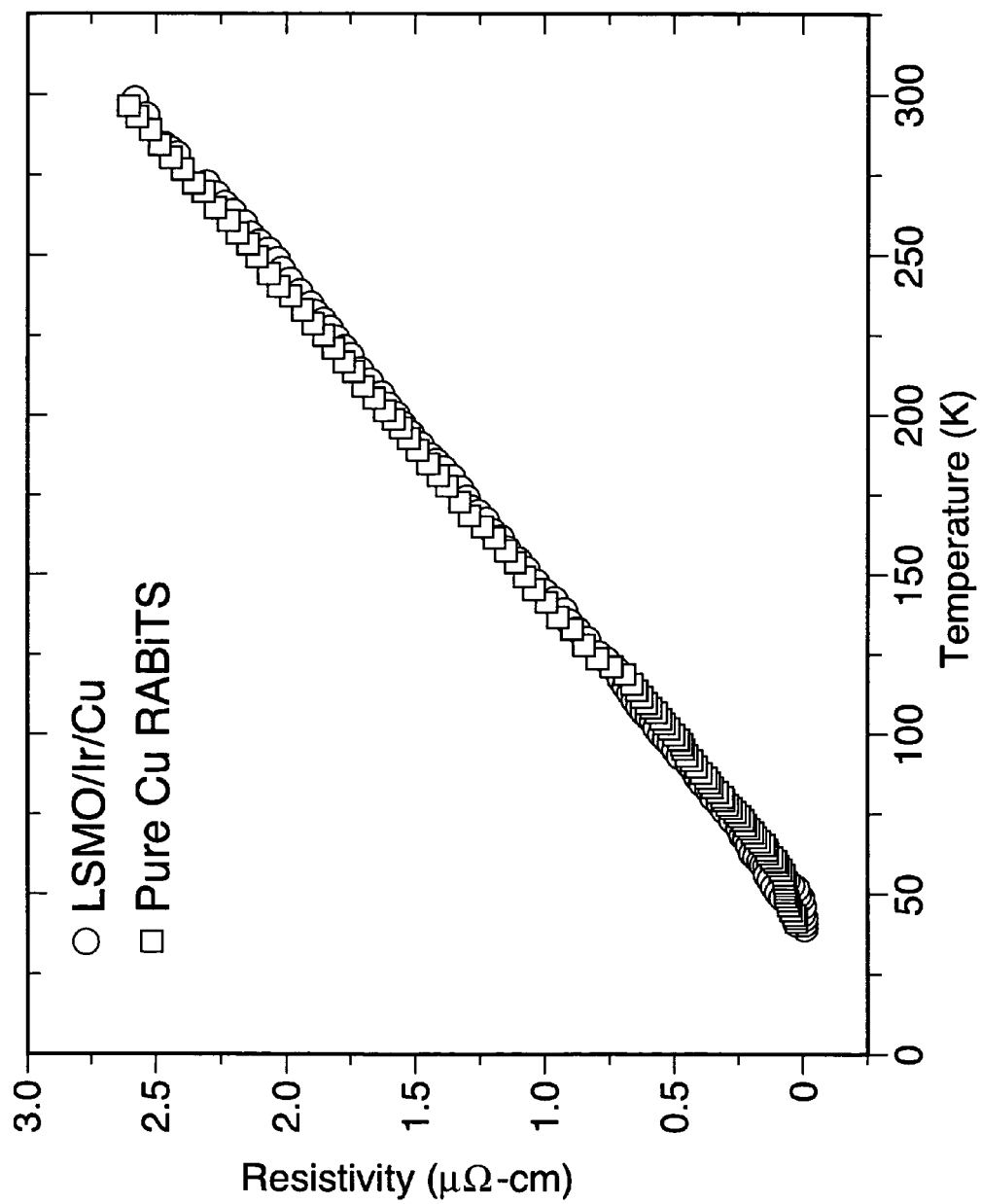
FIG. 12 is a graph of temperature dependent resistivity plots for Cu-RABiTS and LSMO/Ir/Cu substrates in accordance with the present invention. The data indicate that LSMO/Ir buffer layers are electrically connected to the Cu substrate.

A typical θ-2θ scan of a 200 nm thick Ir film grown on a biaxially textured Ni—W substrate using dc sputtering are shown in FIG. 9. The scan indicates the presence of a c-axis aligned, biaxially textured Ir film. The presence of NiO impurities was not observed. Similarly, a typical θ-2θ scan of a 200 nm thick LSMO film grown on a Ir-buffered Ni—W substrate using rf magnetron sputtering is shown in FIG. 10. The scan indicates the presence of a c-axis aligned, biaxially textured LSMO film. Similarly, Ir layers were grown directly on textured Cu substrates and the results are shown in FIG. 11. FIG. 12 indicates the temperature dependent resistivity plot for both pure Cu substrates and as well as LSMO/Ir/Cu substrates. The room temperature resistivity for both structures is approximately 2.5 μΩ/cm. The metallic behavior of both plots indicates that LSMO layers are electrically connected to Cu through Ir layers.

Figure 13:
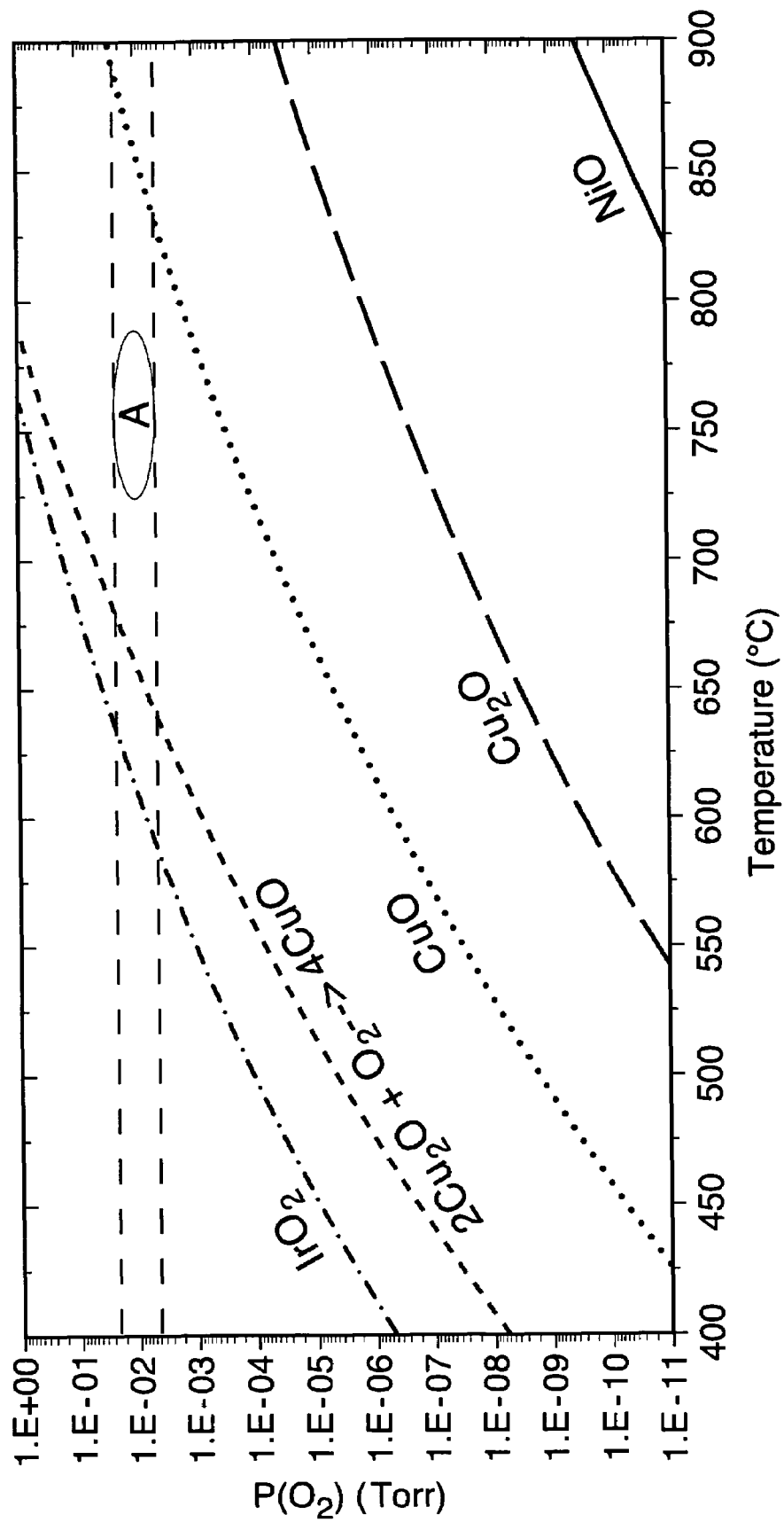
FIG. 13 is a graph of a stability of various oxides under various temperatures and partial pressures of oxygen data generated from thermodynamic calculations.

FIG. 13 is a plot of the dependence of temperature vs. the partial pressure of oxygen towards the stability of various oxides from the thermodynamic calculations. The general region indicated by ellipse A indicates YBCO processing conditions, and the general region indicated by arrow B indicates the conditions where Ir metal is most stable. It is concluded, therefore, that Ir metal is stable under YBCO processing conditions. Since it is possible to grow superconducting YBCO films on these structures without oxidizing the underlying substrates, the present invention represents a significant advance in the art.

EXAMPLE III

Epitaxial Ir buffer layers were deposited ~100 nm thick, some by sputtering and others by pulsed laser deposition, on biaxially textured Ni—W 3% substrates. Detailed X-ray studies showed that Ir is indeed epitaxial. A typical θ-2θ scan for a 100 nm thick Ir buffer layer grown textured Ni—W substrate is shown in FIG. 9. The scan indicates the presence of a c-axis aligned, biaxially textured buffer layer. The buffered substrates were then annealed under YBCO process conditions (i.e., 790° C.; 120 mTorr oxygen pressure, 60 minutes). After the exposure to these conditions, no change was observed in the X-ray pattern. SEM examination revealed no change in microscopic surface features, proving that Ir is stable under YBCO process conditions.

EXAMPLE IV

Figure 14:
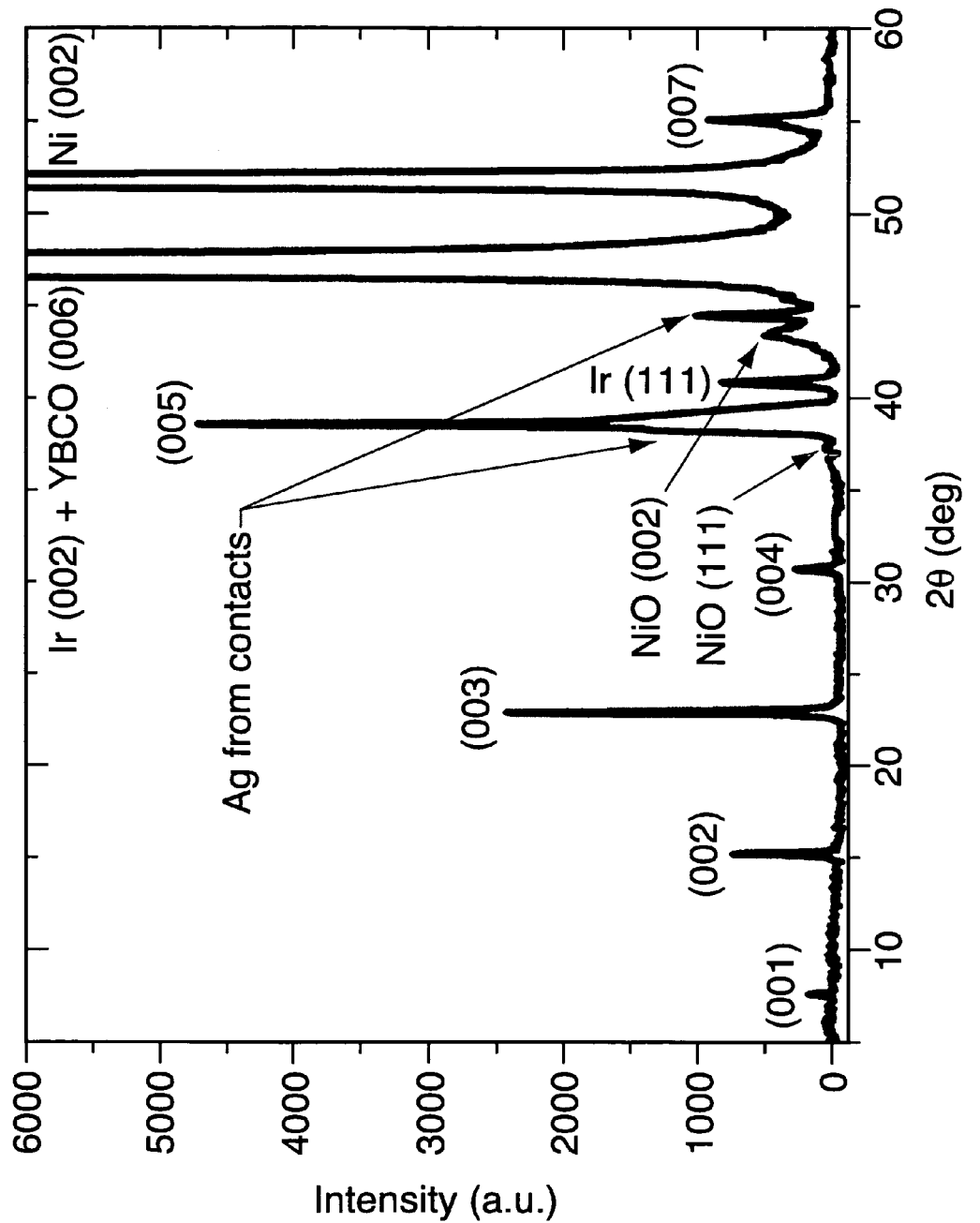
FIG. 14 is a graph of a typical $\theta$-$2\theta$ scan for a c-axis aligned YBCO film grown by PLD on a biaxially textured, 100 nm thick sputtered Ir buffer layer on Ni—W substrate in accordance with the present invention.

YBCO was deposited by pulsed laser deposition (PLD) on a Ir/Ni—W substrate made in accordance with Example III. Deposition was carried out at 790° C. in 120 mTorr oxygen with an average laser energy of 400-410 mJ using a stoichiometric YBCO target, followed by annealing under 550 torr oxygen during cool down. Typical YBCO thickness was 200 nm. A typical θ-2θ scan for a 200 nm thick PLD YBCO film grown on sputtered Ir-buffered Ni—W substrate is shown in FIG. 14. The scan indicates the presence of a highly c-axis aligned, biaxially textured YBCO film.

Figure 15:
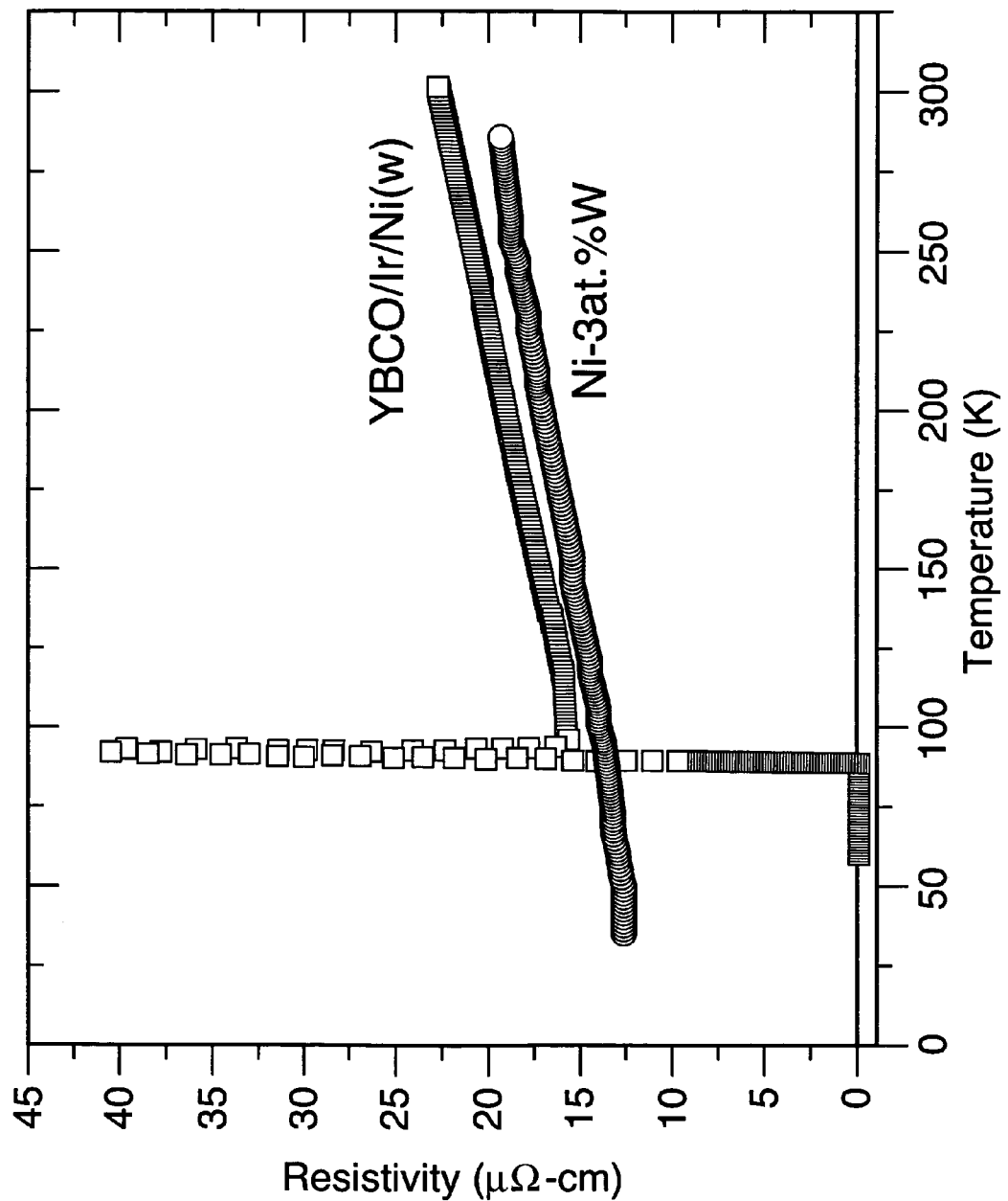
FIG. 15 is a graph of the comparative temperature dependent resistivity for a Ni—W substrate and YBCO/Ir/Ni—W in accordance with the present invention. The data indicate that YBCO superconductor and the Ir buffer layer are electrically connected to the Ni—W substrate.

The temperature dependence resistivity of a YBCO/Ir/Ni—W conductor made in accordance with Example IV was measured and results are plotted in FIG. 15. For comparison, the resistivity of the starting Ni—W substrate is also plotted. The room temperature resistivity is close to 23 μΩ-cm (typical YBCO is expected to be around 250 μΩ-cm). The resistivity decreases as a function of temperature and becomes superconducting at 87 K. The data show that there is a good electrical contact between the substrate and the YBCO superconductor through the metallic Ir buffer layer.

Figure 16:
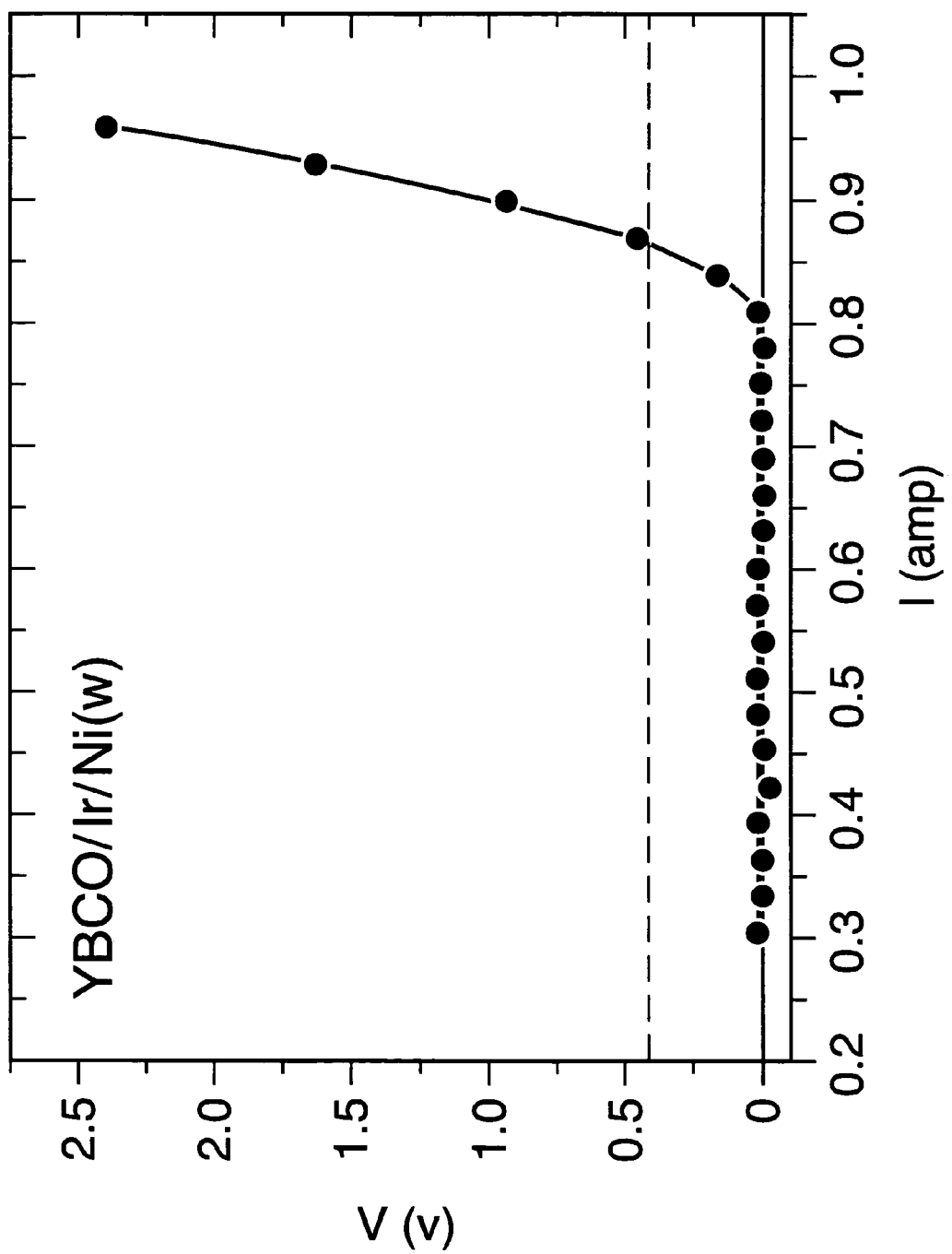
FIG. 16 is a graph of the current-voltage (I-V) curve obtained for YBCO/Ir/Ni—W in accordance with the present invention. The measured $I_c$ of 0.9 A translates to a $J_c$ of 100,000 A/cm$^2$ at 77 K and self-field.

Current-voltage (I-V) characteristics of a YBCO/Ir/Ni—W conductor made in accordance with Example IV are shown in FIG. 16. The measured 0.9 A for a 0.45 cm wide substrate with a YBCO thickness of 200 nm corresponds to a $J_c$ of 100,000 A/$cm^2$ at 77 K and self-field. This is a first demonstration of YBCO film with good properties on Ir surface without any buffer layer therebetween.

EXAMPLE V

YBCO was deposited by pulsed laser deposition (PLD) on a LSMO/Ir/Ni—W substrate made in accordance with Example II. Deposition was carried out in accordance with Example IV. A typical θ-2θ scan for a 200 nm thick PLD YBCO film grown on LSMO/Ir-buffered Ni—W substrate indicated the presence of a highly c-axis aligned YBCO film.

Figure 17:
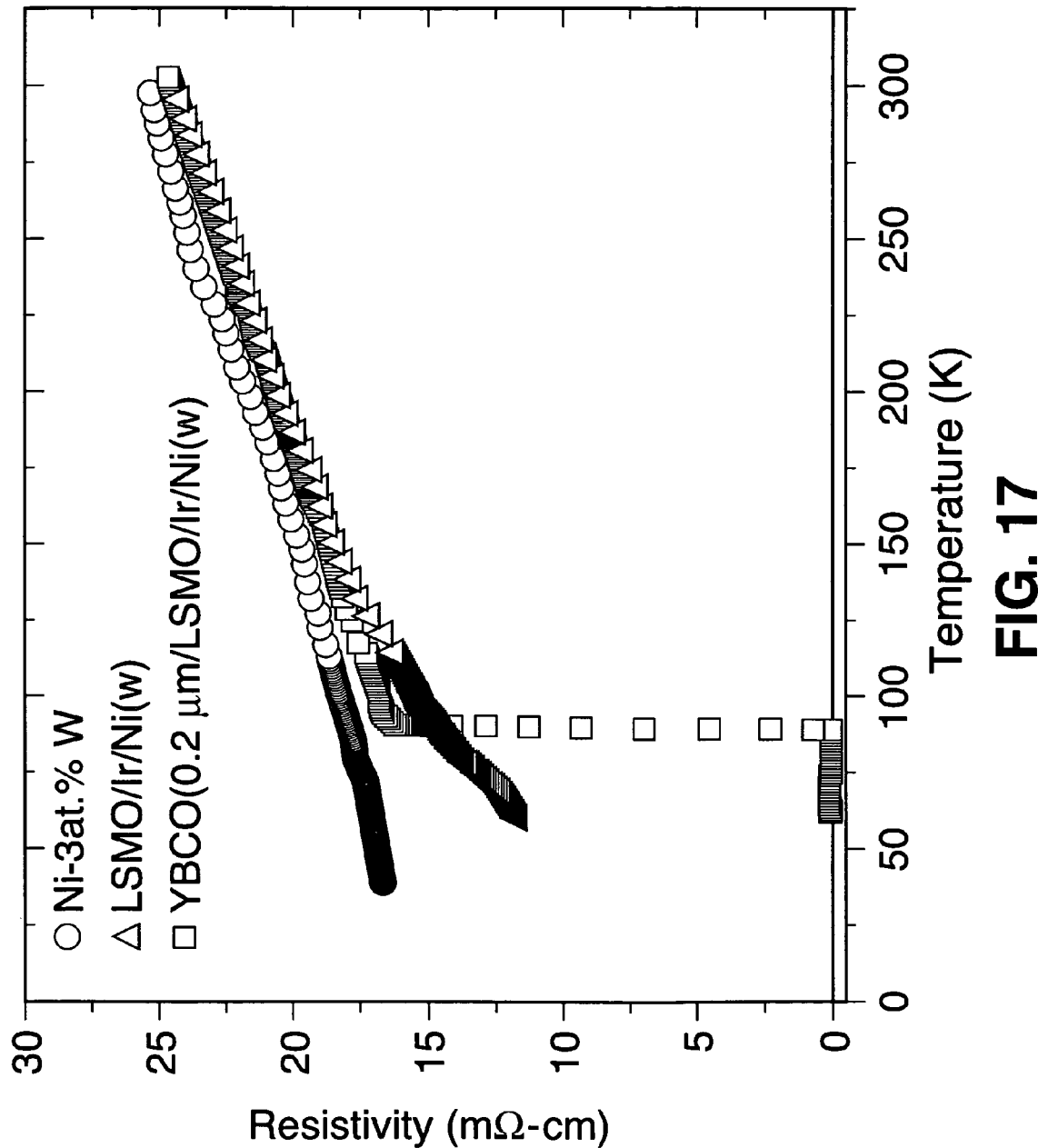
FIG. 17 is a graph of the comparative temperature dependent resistivity for a Ni—W substrate, LSMO/Ir/Ni—W, and YBCO/LSMO/Ir/Ni—W in accordance with the present invention. The data indicate that YBCO superconductor and the LSMO/Ir buffer layer are electrically connected to the Ni—W substrate.

The temperature dependence resistivity of a YBCO/LSMO/Ir/Ni—W conductor made in accordance with Example V was measured and results are plotted in FIG. 17. For comparison, the resistivity of the starting Ni—W substrate and LSMO/Ir/Ni—W are also plotted. The room temperature resistivity is close to 25 μΩ-cm. The resistivity decreases as a function of temperature and becomes superconducting at 88-89 K. The data show that there is a good electrical contact between the substrate and the YBCO superconductor through the metallic LSMO/Ir buffers.

Figure 18:
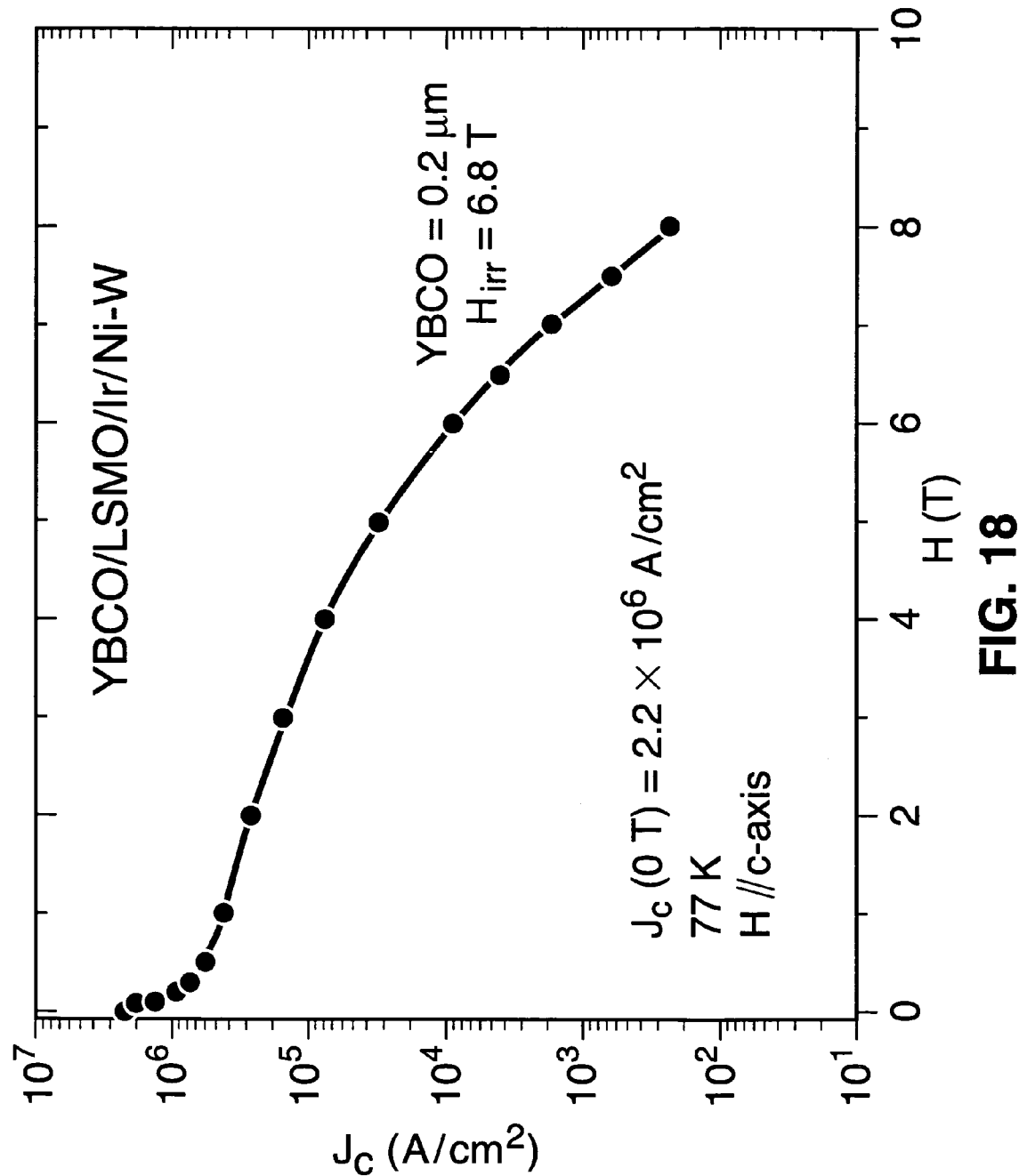
FIG. 18 is a graph of the field dependent critical current density Jc obtained for YBCO/LSMO/Ir/Ni—W in accordance with the present invention.
Figure 20:
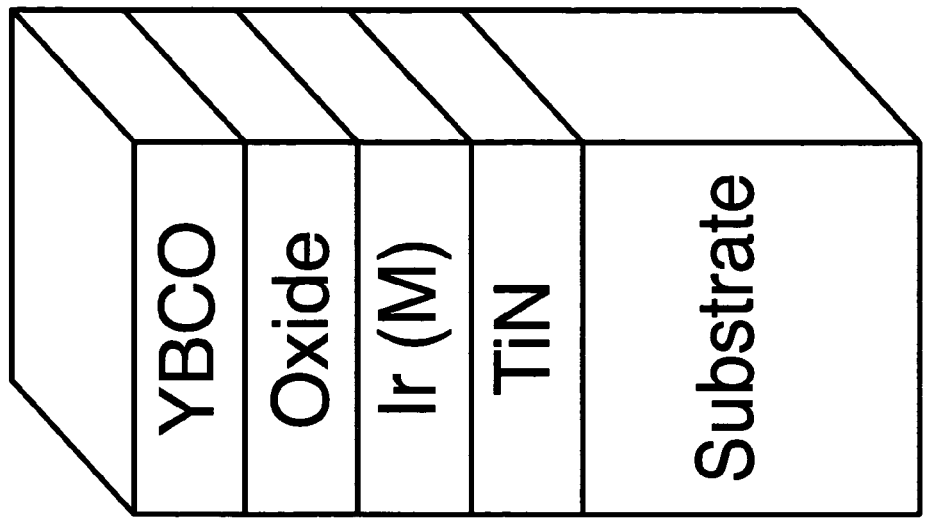
Figure 19:
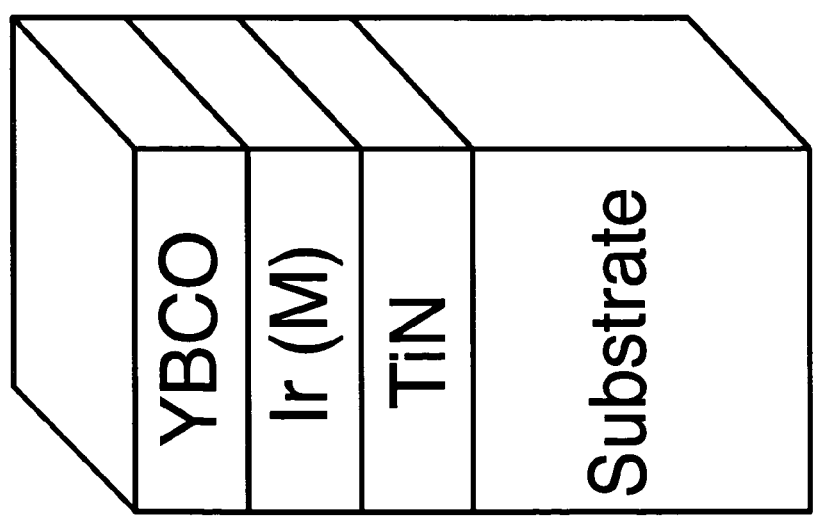
Figure 22:
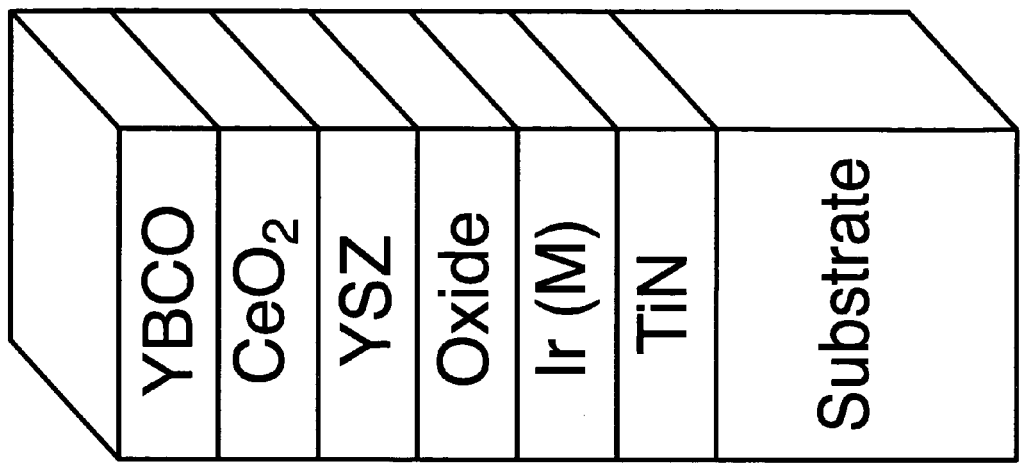
Figure 21:
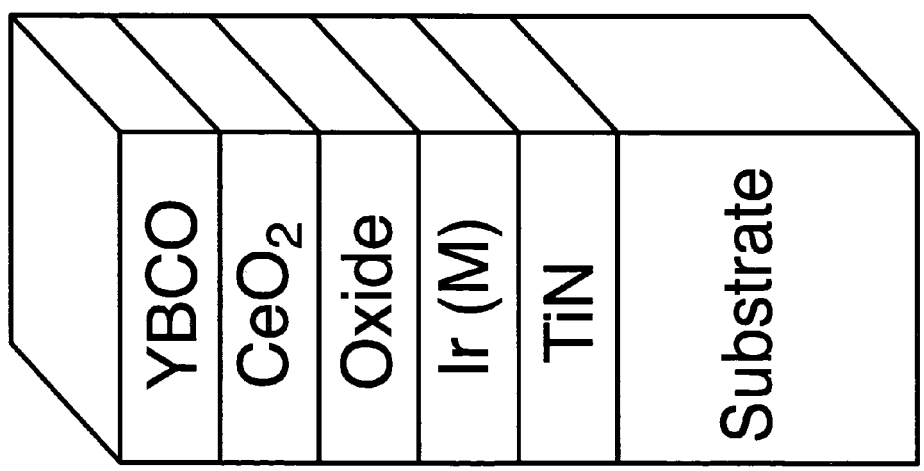

The field dependence critical current density, $J_c$ of a YBCO/LSMO/Ir/Ni—W is shown in FIG. 18. A high $J_c$ of 2.2 MA/cm$^2$ was obtained at 77 K and self-field. This is the highest $J_c$ one can expect from the underlying Ni—W substrate texture using the standard architecture of YBCO/CeO$_2$/YSZ/Y$_2$O$_3$/Ni—W. This is a first demonstration of YBCO films with good connectivity with Ni—W substrate through any buffer.

EXAMPLE VI

Electron beam evaporation was used to grow Ir and CeO$_2$ buffers. Highly aligned Ir buffers were grown epitaxially on textured Ni—W substrates with what is known as "sulfur c 2×2 superstructure". Similarly, CeO$_2$ buffers were deposited on Ir-buffered Ni—W substrates using reactive evaporation of Ce metal in the presence of water. Sulfur c 2×2 superstructure is apparently necessary in order to grow CeO$_2$ buffers on Ir surfaces. This was achieved by annealing Ir buffers in the presence of H$_2$S at 700° C. under the pressure of 10$^{-5}$-10$^{-6}$ Torr. YBCO films have been successfully grown using, for example, the ex-situ BaF$_2$, MOD, TFA processes on Ir/Ni—W substrates with CeO$_2$ buffer systems.

In some cases, an intermediate buffer layer of TiN between the substrate and the Ir layer was found to be beneficial. Nucleation of a TiN buffer layer on a textured Cu or Ni alloy substrate results in improvement of out-of-plane texture. FIGS. 19-22 illustrate some of the various buffer systems that can be made with YBCO in accordance with this particular aspect of the present invention.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A laminate superconducting article comprising:
 a. a substrate;
 b. a biaxially textured buffer system on said substrate, said biaxially textured buffer system comprising at least an intermediate layer of TiN on said substrate, an Ir buffer layer on said TiN layer, and at least one epitaxial buffer layer on said Ir buffer layer; and
 c. an epitaxial layer of a superconductor on said biaxially textured buffer system.

2. A laminate superconducting article in accordance with claim 1 wherein said at least one epitaxial buffer layer is a first buffer layer, and said biaxially textured buffer system further comprises an epitaxial second buffer layer on said first buffer layer.

3. A laminate superconducting article in accordance with claim 2 wherein said biaxially textured buffer system further comprises an epitaxial third buffer layer on said second buffer layer.

* * * * *